(12) United States Patent
Lienau

(10) Patent No.: US 6,288,929 B1
(45) Date of Patent: Sep. 11, 2001

(54) MAGNETO RESISTOR SENSOR WITH DIFFERENTIAL COLLECTORS FOR A NON-VOLATILE RANDOM ACCESS FERROMAGNETIC MEMORY

(75) Inventor: Richard M. Lienau, Pecos, NM (US)

(73) Assignee: Pageant Technologies, Inc., Toronto (CA)

(*) Notice: Subject to any disclaimer, the term of this patent is extended or adjusted under 35 U.S.C. 154(b) by 0 days.

(21) Appl. No.: 09/516,175

(22) Filed: Feb. 29, 2000

Related U.S. Application Data

(60) Provisional application No. 60/121,901, filed on Mar. 4, 1999.

(51) Int. Cl.[7] .................................................. G11C 11/22
(52) U.S. Cl. ........................................................... 365/145
(58) Field of Search .................................... 365/145, 157, 365/65, 66, 171, 172, 173

(56) References Cited

U.S. PATENT DOCUMENTS

| | | | |
|---|---|---|---|
| 3,048,829 | 8/1962 | Bradley | 340/174 |
| 3,223,985 | 12/1965 | Bittmann et al. | 340/174 |
| 3,418,645 | 12/1968 | Fussell | 340/174 |
| 3,466,634 | 9/1969 | Gamblin | 340/174 |
| 3,613,013 | 10/1971 | Vallese | 328/324 |
| 3,714,523 | 1/1973 | Bate | 317/235 |
| 3,727,199 | 4/1973 | Lekven | 340/174 |
| 4,283,643 | 8/1981 | Levin | 307/309 |
| 4,360,899 | 11/1982 | Dimyan et al. | 365/171 |
| 4,607,271 | 8/1986 | Popovic et al. | 357/27 |
| 4,791,604 | 12/1988 | Lienau | 365/9 |
| 4,803,658 | 2/1989 | Grimes | 365/87 |
| 4,831,427 | 5/1989 | Coleman, Jr. et al. | 357/27 |
| 4,887,236 | 12/1989 | Schloemann | 365/173 |
| 5,065,362 * | 11/1991 | Herd et al. | 365/154 |
| 5,068,826 | 11/1991 | Matthews | 365/170 |
| 5,075,247 | 12/1991 | Matthews | 437/52 |
| 5,089,991 | 2/1992 | Matthews | 365/9 |
| 5,107,460 | 4/1992 | Matthews | 365/122 |
| 5,206,590 | 4/1993 | Dieny et al. | 324/252 |
| 5,208,477 | 5/1993 | Kub | 257/421 |
| 5,289,410 | 2/1994 | Katti et al. | 365/170 |
| 5,295,097 | 3/1994 | Lienau | 365/14 |
| 5,329,480 | 7/1994 | Wu et al. | 365/170 |
| 5,329,486 | 7/1994 | Lage | 365/145 |
| 5,396,455 | 3/1995 | Brady et al. | 365/170 |
| 5,477,482 | 12/1995 | Prinz | 365/129 |
| 5,565,695 * | 10/1996 | Johnson | 257/295 |
| 5,579,258 * | 11/1996 | Adachi | 365/145 |
| 5,652,445 * | 7/1997 | Johnson | 257/295 |
| 5,661,062 | 8/1997 | Prinz | 438/3 |
| 5,684,775 | 11/1997 | Ishishita | 338/32 R |
| 5,793,697 * | 8/1998 | Scheuerlein | 365/230.07 |
| 5,864,498 | 1/1999 | Womack | 365/173 |
| 5,926,414 | 7/1999 | McDowell et al. | 365/170 |
| 5,930,165 | 7/1999 | Johnson et al. | 365/171 |
| 6,034,887 | 3/2000 | Gupta et al. | 365/171 |

* cited by examiner

*Primary Examiner*—Richard Elms
*Assistant Examiner*—Anh Phung
(74) *Attorney, Agent, or Firm*—Jones, Waldo, Holbrook & McDonough; Michael W. Starkweather; Brent T. Winder

(57) ABSTRACT

A non-volatile RAM device is disclosed which utilizes a plurality of ferromagnetic bits (6) each surrounded by a coil of a write line (13) for directing the remnant polarity thereof is disclosed. The direction of magnetic remnance in each bit (6) is dictated by the direction of a current induced into write line (13). Further, a magneto sensor (7) comprising a magneto resistor (1) coupled to a pair of collectors (2a & 2b) is placed approximate each bit (6). The magneto resistor (1) is coupled to a control circuit (30) for receiving current. The current passing across magneto resistor (1) is biased in a direction either right or left of the original current flow direction. The collectors are coupled to a pair of sense lines (4a & 4b), which are in turn, coupled to a voltage differential amplifier (12). The collector in the direction of biased current flow, will receive a greater number of electrons than the other collector, and therefore have a greater negative charge. This voltage differential is conducted through the sense lines (4a & 4b) to the voltage differential amplifier (12), where it is amplified and detected.

31 Claims, 4 Drawing Sheets

MAGNETO RESISTOR SENSOR WITH DIFFERENTIAL COLLECTORS FOR A NON-VOLATILE RANDOM ACCESS FERROMAGNETIC MEMORY

PRIORITY OF THE INVENTION

This application claims priority to co-pending U.S. Provisional Application No. 60/121,901, filed Mar. 4, 1999.

The following provisional patent applications are related to the present invention:

Ser. No. 60/122,731
Ser. No. 60/122,733
Ser. No. 60/121,925
Ser. No. 60/122,822

THE FIELD OF THE INVENTION

The present invention relates to non-volatile random access memory. More particularly, the present invention relates to a magneto-resistor sensor with differential collectors for a non-volatile random access ferromagnetic memory.

BACKGROUND OF THE INVENTION

Computer memory technology has experienced profound advances in the last two decades. One of the first computer memories involved magnetic core memory technology. To form each magnetic core, a miniature toroidal-shaped ferrite core was interwoven into a fine matrix of wires. By applying a current through the wires, the core would be programmed with either a north or south directed flux path that would correspond to a logic one or zero. The advantage of magnetic core memory is that it is non-volatile, or does not need to be refreshed to remember the stored logic signal. Additionally, Core memory is also "radiation-hard" or unaffected by ionizing radiation like gamma rays. However, the assembly of the magnetic core array was very labor intensive and was quickly abandoned when semiconductor processes were developed.

Currently one of the most popular memory technologies uses either a form of MOS (metal-oxide-semiconductor) or CMOS (complementary metal-oxide-semiconductor) processes. However, it is well known that this technology requires constant refreshing of each memory cell to maintain the logic signal strength due to the inherent leakage of capacitors. This constant refreshing of the memory cells is not a problem when there is an unlimited voltage source, but in many applications, like laptop computers and cell phones, there is a finite supply. To deal with this problem, rechargeable batteries have been used in all portable electrical devices.

The problem with using devices that have capacitive memory arrays is the inconvenience in keeping the batteries properly charged every few hours. Therefore, there is a need for a non-volatile memory device that does not need to be refreshed and is inexpensive and quick to make.

Examples of patents related to non-volatile RAM, each of which are herein incorporated by reference for their supporting teachings, are as follows:

U.S. Pat. No. 4,360,899 to Dimyan et al. teaches a non-volatile random access memory having a plurality of magnetic cells arranged in an array on a major surface of a substrate. In operation, a single magnetic cell is selected and inductively switched between opposite remnant, (i.e. permanent) states, upon the simultaneous application of electrical pulses to a pair of conductors intersecting adjacent the selected cell. Each electrical pulse has an amplitude which is insufficient to inductively switch the remnant state of the selected cell. However, the combined amplitude of the electrical pulses is at least equal to the amplitude required for such a switch.

U.S. Pat. No. 5,068,826 to Mathews teaches a non-volatile, static magnetic memory device, whose operation is based on the Hall effect. The device includes a magnetic patch which stores data in the form of a magnetic field, a semiconductor Hall bar, and a pair of integrally-formed bipolar transistors which are used for amplifying and buffering the Hall voltage produced along the Hall bar. In use, current is forced to flow down the length of the Hall bar causing a Hall voltage to be developed in a direction transverse to the direction of both the magnetic field and the current. The bases of the bipolar transistors are ohmically coupled to the Hall bar to sense the Hall voltage—the polarity of which is representative of the stored information. Finally, a system of current carrying conductors is employed for writing data to individual magnetic patches.

U.S. Pat. No. 5,295,097 to Lienau teaches a nonvolatile random access memory having a substrate that carries separate magnetically polarizable domains. Each domain is surrounded by a full write loop member, and arranged to penetrate a Hall channel of a dual drain FET with its residual magnetic field. The domains are organized in word rows and bit columns, are each written to by a single full write current through the surrounding loop member, and each read by a comparator connected to the FET drains. Independent separate write lines and read lines are used in writing and reading the values of each magnetic bit.

U.S. Pat. No. 4,791,604 to Lienau et al. teaches a sheet random access memory (SHRAM). The SHRAM is a non-volatile and transportable memory characterized by its cell density and relatively small size and power requirements, but having the nonvolatile character and rugged transportability of core memory, or magnetic disks or tape. The SHRAM is further characterized by a memory comprising a two dimensional magnetic substrate and a fixed driving device for writing and reading into the substrate. Further, a fixed sensing device for sensing the information is attached at each cell location. The memory media includes not only a homogeneous two dimensional substrate, but also ferrite cores formed into the substrate by photolithographic techniques, wherein the information is stored within the core and read by the sensing device from a gap defined by the core. Memory cells according to the invention can thus be arranged and organized to form destructive readout RAMs, or nondestructive readout Rams in both serial and parallel form.

U.S. Pat. No. 5,926,414 to McDowell et al. teaches a magnetic integrated circuit structure in combination with a carrier-deflection-type magnetic field sensor. Each of a variety of magnet structures realize a condition in which the magnetic field is substantially orthogonal to the direction of travel of carriers of a sense current, thereby achieving maximum sensitivity. By basing a magnetic memory cell on a single minium size MOS device, a small cell may be realized that compares favorably with a conventional DRAM of FLASH memory cell. The greater degree of control over the magnetic field afforded by the magnetic structures enables the cross-coupling between cells in a memory array to be minimized.

U.S. Pat. No. 3,727,199 to Lekven teaches a magnet memeory element and a process for producing such elements in plurality to constitute a static magnetic memory or digital information storage system. Individual binary storage members are afforded directionally preferential magnetic characteristics by flux circuits to establish the preferred axis of magnetization. Conductors for driving the individual binary storage members (for storing and sensing) are provided in an organized pattern to accomplish selectivity. A batch production process is also disclosed.

SUMMARY OF THE INVENTION

It is therefore a feature of the present invention to provide a nonvolatile ferromagnetic RAM device that is capable of reading the data stored in each memory cell quickly and efficiently utilizing a minimal number of components. Specifically, there is a nonvolatile ferromagnetic RAM that is capable of reading the data stored in each magnetic bit.

Additionally, a feature of the invention is to provide a ferromagnetic memory cell, comprising a bit (6), made of a ferromagnetic material, having a remnant polarity. There is also a write line (13), located proximate the bit, coupled to receive a current sufficient to create the remnant polarity. Further, there is a magneto sensor (7) that has a magneto resistor (1) positioned proximate the bit (6), having a current flow direction responsive to the remnant polarity of the bit (6); and a pair of collectors (2a & 2b) attached to the magneto resistor (6) for collecting current.

Another feature of the invention is to provide a memory cell with a control circuit (30) coupled to the magneto resistor (1) and to write line (13). The control circuit is activated during both read and write functions and is made up of a read/write drive circuit (11) and a read/write switch (9). When a selected read/write switch is activated, write functions are accomplished by the simultaneous activation of the read/write drive circuit (11), and a write drive circuit (31), and read functions are accomplished by the simultaneous activation of the write drive circuit (11) and a voltage differential amplifier (12).

Yet, an additional feature of the invention is to provide a memory cell with a voltage differential amplifier (12), for amplifying and detecting a voltage differential received from a pair of sense lines (4a & 4b). The pair of sense lines (4a & 4b) receive a voltage differential created in the collectors (2a & 2b) and conduct it to the differential amplifier (12).

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

It is noted that the drawings of the invention are not so scale. The drawings are merely schematic representations, not intended to portray specific parameters of the invention. The drawings are intended to depict only selected embodiments of the invention, and therefore should not be considered to be limiting the scope of the invention. The invention will be described with additional specificity and detail through the use of the accompanying drawings. Like numbering between figures represent like elements.

DETAILED DESCRIPTION OF THE PREFERRED EMBODIMENT

The applicant has discovered that the reading of binary data stored within a ferromagnetic bit may be accomplished easily and efficiently using a magneto sensor in intimate communication therewith. Such a device requires no moving parts or refreshing of stored logic signals, and is capable of sensing magnetically stored data at the micron and submicron levels.

Figure 1:
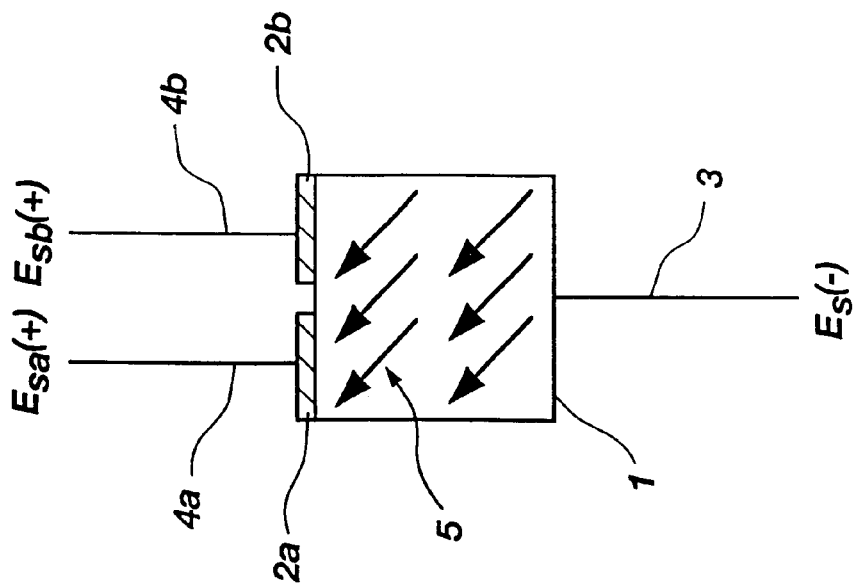
FIG. 1 is a schematic view of a prior art magneto resistor with a pair of collectors, having a current flow directed to the right.
Figure 2:
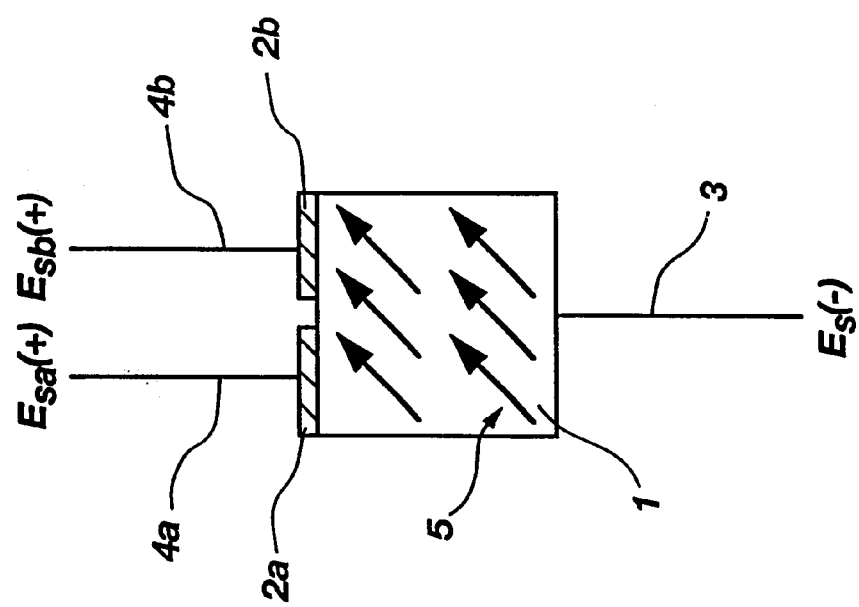
FIG. 2 is a schematic view of a prior art magneto resistor with a pair of collectors, having a current flow directed to the left.

Referring now to FIGS. 1 and 2, there is shown a prior art Hall semiconductor configured as magneto resistor 1 (referred to as MR1) with a pair of collectors 2a and 2b disposed equidistant from the longitudinal center of magneto resistor 1, and opposite the current source Es, and input or write line 3. The current received from input line 3, is biased in a selected direction, either left or right, as indicated by flow arrows 5. The biasing of current flows MR1 is positioned proximate a magnetic flux field (not shown) that is flowing through MR1.

In the case of FIG. 1, the current is biased to the right due to the remnance of the magnetic field being exerted on MR1. Therefore, the electrons of MR1 are crowded toward the right, causing the majority of them to flow into collector 2b. The same process happens in FIG. 2 only in an opposite manner, causing majority electron flow into collector 2a, as the current flow is biased to the left due to the remnance of a reversed magnetic field exerted on MR1.

Electrons transferred into collectors 2a and 2b flow into sense lines 4a and 4b respectively. Because of the directional bias 5 created by the magnetic field exerted on MR1, one sense line will receive more electrons than the other, and thus have a greater negative charge. The imbalance in charge between sense lines 4a and 4b creates a voltage differential which is transferred along sense lines 4a and 4b to voltage differential amplifier 12, shown in FIG. 3.

Figure 3:
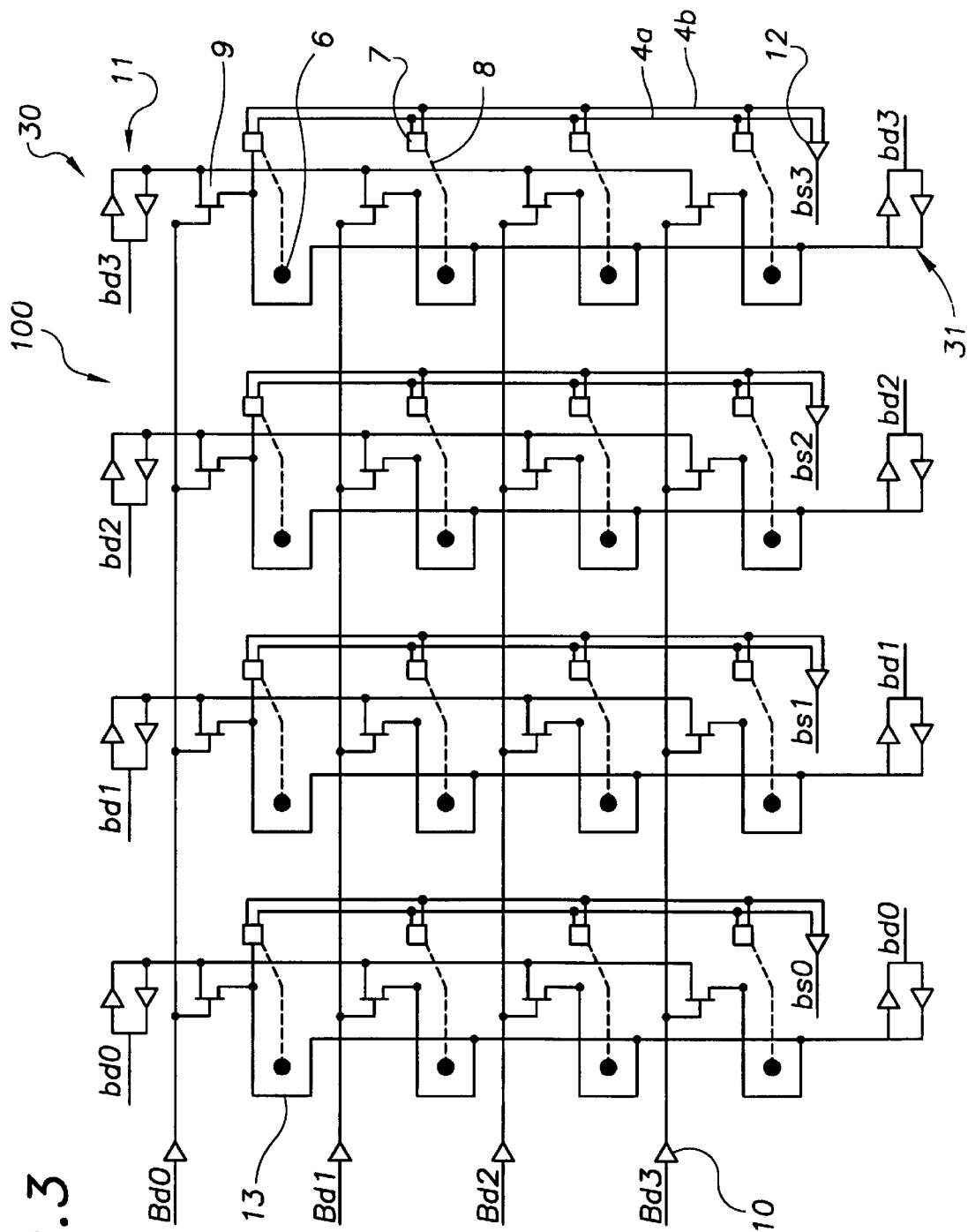
FIG. 3 is a is a schematic diagram of the nonvolatile random access ferromagnetic memory of the present invention.

Referring now to FIG. 3, there is shown a partial schematic of a four by four random access memory matrix 100 of the present invention. A plurality of individual ferromagnetic bits 6 are each surrounded by a coil, generally indicated by write or drive line 13. Magneto sensor 7, comprising MR1, with a pair of collectors 2a and 2b disposed thereon, is placed proximate to storage bit 6. The magnetic field produced by bit 6, which effects magneto sensor 7, is represented by dashed line 8. It is noted that bit 6 is really located right under or on top of sensor 7, but is best illustrated schematically with the dash line 8. Control circuit 30 comprises read/write drive circuit 11, read/write switch 9, and input amplifier 10. Control 30 is coupled to write line 13, and to magneto sensor 7. This dual coupling allows control 30 to be used during both set (write) and sense (read) operations. Write drive circuit 31 is also coupled to write line 13, but at the opposite end. Additionally, voltage differential amplifier 12 is coupled to sense lines 4a and 4b as illustrated.

During write operations of a single memory cell, appropriate segments of control circuit 30 and write drive circuit 31 are selected simultaneously. Thus, one skilled in the art will easily understand that current is directed in a desired direction, as defined by the requirement to set a "0" or a "1" around any given memory cell.

Similarly, during sense, or "read" operations of a single memory cell, appropriate sections of control circuit 30 and sense amplifier 12 are simultaneously activated. Thus, one skilled in the art will easily understand how individual memory cells can be read. Therefore, a skilled artisan will realize the advantage in using the same control circuit 30 in combination with the read 12 and write 31 circuits, instead of having duplicate controls.

Figure 4:
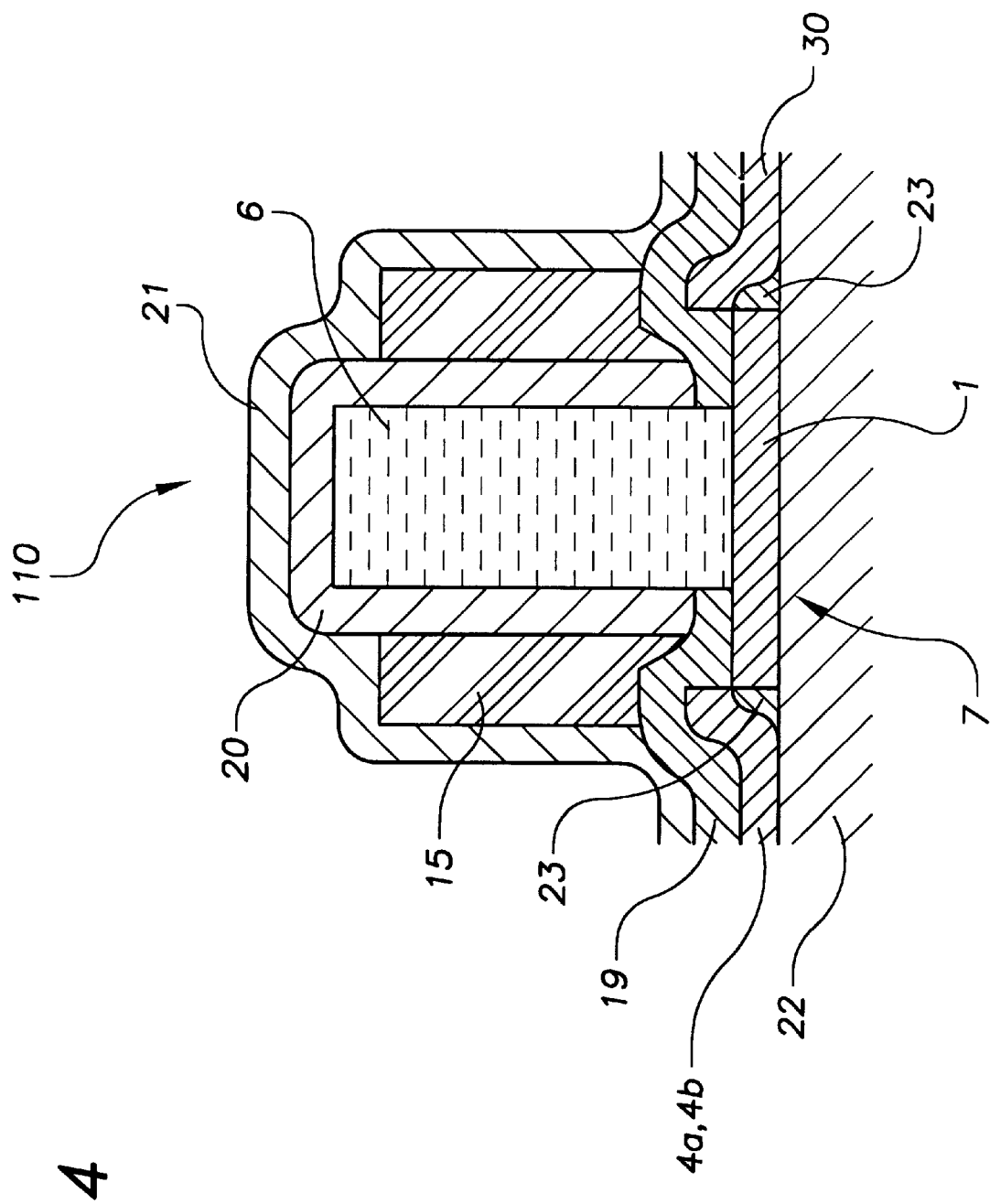
FIG. 4 is a side sectional view of the memory cell elements presented in FIG. 3, having a magneto sensor disposed below a ferromagnetic bit.
Figure 5:
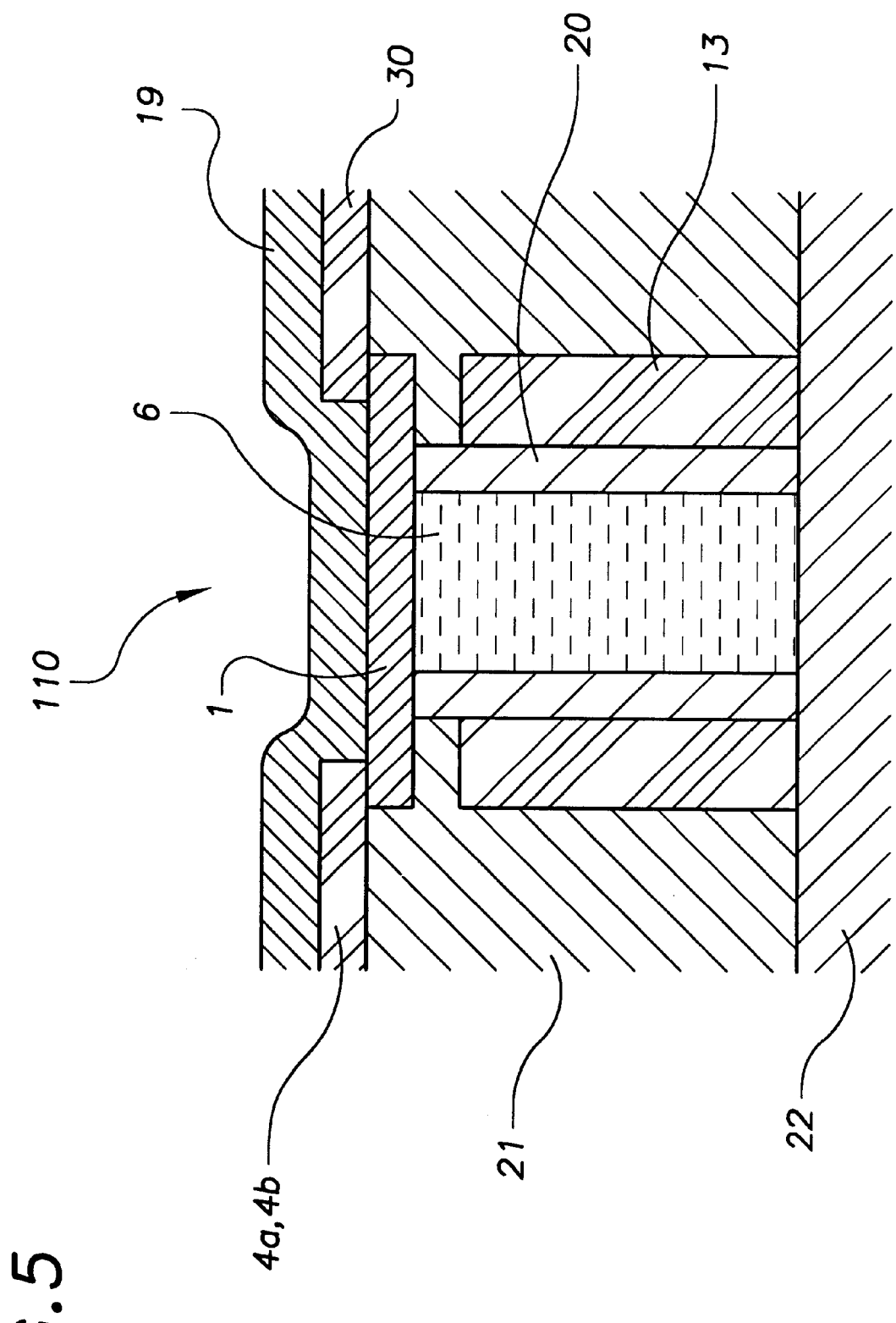
FIG. 5 is a side sectional view of the memory cell elements presented in FIG. 3, having a magneto sensor disposed above a ferromagnetic bit.

Referring now to FIGS. 4 and 5, there are shown typical cross-sections of a single micron or sub-micron scale ferromagnetic memory cell element 110. Specifically, there is a magneto sensor 7.

A ferromagnetic storage element, or "bit," 6, is placed upon a substrate 22, and surrounded by a coil or set (write) line 13. The bit 6 preferably has a height to width aspect ratio of greater than 1:1. Substrate 22 may be made of any well known substance for making substrates such as silicon, glass, GaAs, etc., and write line 13 may be made of any suitable conductive material known to those skilled in the art such as Al, Cu, etc. A layer of insulation 20, is disposed between write line 13, and bit 6. Further, insulative layers 19, 21, and 23 are insulation material, and are disposed in the memory cell as needed. All of the insulative layers present may be made of any suitable insulative material well known in the art, such as $SiO_2$ or $Si_3N_4$, etc.

Magneto sensor 7, is placed proximate to, and may be physically coupled with bit 6. Magneto sensor 7 comprises a magneto resistor 1, which is made of a high-mobility semiconductor material such as InSb, with a pair of collectors (not shown), as in FIGS. 1 and 2, disposed thereon. The pair of collectors may be made of any conductive material known to those ordinarily skilled in the art, and are coupled to sense lines 4a and 4b, shown as a single line from the side. Further shown is an input lead from control circuit 30, attached to magneto resistor 1, at the end opposite to that of the collectors (not shown), and the sense lines 4a and 4b.

Note that no insulation is shown between sensor 7 and ferromagnetic bit 6, since no electrical potential exists between them in this configuration. This can be an advantage in that the sensor and bit are more intimately related than if there were insulation separating them, which makes for greater electrical sensitivity of the cell. Finally, substrate 22 and memory cell 110 may be fabricated by any method known to those skilled in the relevant art, such as electroplating, sputtering, E-beam deposition, chemical vapor deposition, micro-machining, nano-technology and molecular beam epitaxy.

Method of Operation

In operation, and referring to FIG. 3, the first step is to write logical values into each bit 6. Specifically, read/write circuitry 30 and write circuit 31 are respectively activated for each memory cell. Uniquely, depending upon the direction of the current flow through write line 13, a logical "zero" or "one" is stored in the specific bit. Advantageously, unlike prior art designs, the complete memory array can be disconnected from the power or turned off at this time and all of the digital data stored in the array will be preserved. Where, previous memory designs must constantly be refreshed to maintain the digital data stored therein. Thus, this invention will save power over prior art designs.

To read the digital data in the present invention, the same read/write circuitry 30 is activated along with the appropriate read circuitry 12. Specifically, current is routed to sense circuitry 7. Current, as it enters from line 3, will be mostly directed to either line 4a or 4b, dependent upon the remnant polarity of the adjoining bit. Differential amp 12 will sense the difference between the lines, which will indicate that a logical "zero" or "one" was stored in the associated bit.

Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function, manner of operation, assembly, and use may be made without departing from the principles and concepts set forth herein.

For example, insulation layer 22 may be eliminated in some circumstances. The exact alignment of parts, like collectors 2a and 2b on magneto resistor 1, are not always essential and may work better if misalignment is encouraged.

What is claimed is:

1. A ferromagnetic memory circuit having a plurality of memory cells, each of the memory cells comprising:
    a) a bit, made of a ferromagnetic material, having a remnant polarity and a height to width ratio of greater than 1:1;
    b) a write line, located proximate the bit, coupled to receive a current sufficient to create the remnant polarity of the bit;
    c) a magneto sensor including:
        1) a magneto resistor, in intimate contact with the bit, having a current flow direction responsive to the remnant polarity of the bit; and
        2) a pair of collectors, coupled to the magneto resistor, to collect current from the magneto resistor and create a voltage differential therebetween; and
    d) a control circuit, electrically coupled to the write line and the magneto sensor, to provide separate current during the write and read operations.

2. The memory circuit of claim 1, further comprising:
    a) a pair of sense lines, coupled to the pair of collectors respectively, to convey the voltage differential away from the collectors; and
    b) a differential amplifier, coupled to the pair of sense lines, to amplify and detect the voltage differential.

3. The memory circuit of claim 2, wherein the control circuit further comprises:
    a) a read/write drive circuit, coupled to feed current into the write line in a first and second direction, and to feed current into the magneto resistor; and
    b) a read/write switch, coupled between the read/write drive circuit and the write lines and the magneto resistor, designed to control which bit is activated during both writing and reading operations.

4. The memory circuit of claim 3, wherein the read/write switch is a transistor.

5. The memory circuit of claim 4, wherein current is directed across the magneto resistor by the control circuit when the differential amplifier is activated.

6. The memory circuit of claim 4, further comprising a write drive circuit, coupled to the write line to feed current to the write line in the second direction.

7. The memory circuit of claim 3, wherein current is directed through the write line in either the first or a second direction when control circuit and the write drive circuit are activated simultaneously.

8. The memory circuit of claim 4, wherein the collectors are coupled to the magneto resistor at points of attachment that are opposite a point of attachment for an input lead of the control circuit.

9. The memory circuit of claim 1, further comprising a base, oriented in a horizontal plane, wherein the bit has a height that is oriented perpendicular to the horizontal plane of the base.

10. The memory circuit of claim 9, wherein the write line circumscribes proximate a periphery of the bit.

11. The memory circuit of claim 10, wherein the magneto sensor is placed below the bit in a substrate upon which the bit is disposed.

12. The memory circuit of claim 10, wherein the magneto sensor is placed above the bit.

13. The memory circuit of claim 2, wherein a digital value of "1" is indicated when an amount of current in a designated sense line is greater than an amount of current in the other sense line.

14. The memory circuit of claim 2, wherein a digital value of "0" is indicated when an amount of current in a designated sense line is greater than an amount of current in the other sense line.

15. A method of storing and retrieving binary data, comprising the steps of:
  a) providing a memory bit, made of ferromagnetic material, having a remnant polarity and a height to width ratio of greater than 1:1;
  b) directing the polarity of the bit by sending a current along a write line, located proximate the bit;
  c) detecting the polarity of the bit by:
    1) sending a current through a magneto sensor that is physically coupled with the bit; and
    2) reading an electrical differential created by the magneto sensor; and
  d) using a control circuit to both direct the polarity of the bit and detect polarity of the bit.

16. The method of claim 15, wherein the magneto sensor, further comprising:
  a) a magneto resistor, positioned proximate the bit, having a current flow direction responsive to the remnant polarity of the bit; and
  b) a pair of collectors, which are electrically independent from each other, coupled to the magneto resistor, and evenly spaced from the center thereof, to collect current flowing across the magneto resistor and create a voltage differential.

17. The method of claim 16, further comprising the steps of:
  a) coupling the pair of collectors to a pair of sense lines which transfer the voltage differential away from the pair of collectors; and
  b) coupling the pair of sense lines to a differential amplifier that amplifies the voltage differential.

18. The method of claim 15, wherein the control circuit further comprises:
  a) a read/write drive circuit, coupled to feed current into the write line in a first direction, and to feed current into the magneto resistor; and
  b) a read/write switch, coupled to the read/write drive circuit, to control which bit is activated during both writing and sensing operations.

19. The method of claim 18, wherein the read write switch is a transistor.

20. The method of claim 16, wherein the collectors are coupled to the magneto resistor at points of attachment which are directly opposite a point of attachment for an input lead of the control circuit.

21. The method of claim 17, wherein current is directed across the magneto resistor by the control circuit when the differential amplifier is activated.

22. The method of claim 15, further comprising the step of:
  providing a write drive circuit, coupled to the write line, to feed current to the write line in a second direction.

23. The method of claim 22, wherein current is directed through the write line in either a first or second direction when the control circuit and the write drive circuit are activated simultaneously.

24. The method of claim 15, further comprising the step of:
  providing a base, oriented in a horizontal plane, wherein the bit has a height that is oriented perpendicular to the horizontal plane of the base.

25. The method of claim 24, wherein the magneto sensor is placed below the bit in a substrate upon which the bit is disposed.

26. The method of claim 24, wherein the magneto sensor is placed above the bit.

27. The method of claim 25, wherein the write line circumscribes proximate a periphery of the bit.

28. The method of claim 17, wherein a digital value of "1" is indicated when an amount of current in a designated sense line is greater than an amount of current in the other sense line.

29. The method of claim 17, wherein a digital value of "0" is indicated when an amount of current in a designated sense line is greater than an amount of current in the other sense line.

30. A memory circuit, having a plurality of memory cells, each memory cell comprising:
  a) a bit made of ferromagnetic material, having a remnant polarity and a height to width ration of greater than 1:1;
  b) write means, coupled proximate the bit for writing a remnance polarity into the bit during a write operation;
  c) read means, physically coupled to the bit for reading the remnant polarity of the bit during a read operation; and
  d) control means, coupled to the read means and the write means, for controlling which cell is to be activated during the read and write operations.

31. A method of storing and reading binary data comprising the steps of:
  a) providing a bit made of ferromagnetic material having a remnant polarity and a height to width ration of greater than 1:1;
  b) writing a remnant polarity into the bit during a write operation;
  c) reading the remnant polarity of the bit during a read operation; and
  d) using a singular control circuit to perform both steps b) and c) above.

* * * * *